United States Patent
Cho

(10) Patent No.: US 8,053,785 B2
(45) Date of Patent: Nov. 8, 2011

(54) TUNNELING FIELD EFFECT TRANSISTOR SWITCH DEVICE

(75) Inventor: Jin Cho, Palo Alto, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 200 days.

(21) Appl. No.: 12/468,612

(22) Filed: May 19, 2009

(65) Prior Publication Data
US 2010/0295058 A1   Nov. 25, 2010

(51) Int. Cl.
*H01L 31/0312* (2006.01)
(52) U.S. Cl. ............ 257/77; 257/76; 257/328; 257/329; 257/E31.024
(58) Field of Classification Search ............... 257/70–77, 257/328, 329, E31.024
See application file for complete search history.

(56) References Cited

U.S. PATENT DOCUMENTS
2008/0290420 A1 * 11/2008 Yu et al. ............... 257/374
* cited by examiner

*Primary Examiner* — N Drew Richards
*Assistant Examiner* — Mamadou Diallo
(74) *Attorney, Agent, or Firm* — Ingrassia Fisher & Lorenz, P.C.

(57) ABSTRACT

A tunneling field effect transistor (TFET) device includes a semiconductor substrate having a layer of relatively intermediate bandgap semiconductor material, a layer of relatively low bandgap semiconductor material overlying the layer of relatively intermediate bandgap semiconductor material, and a layer of relatively high bandgap semiconductor material overlying the layer of relatively low bandgap semiconductor material. The TFET device includes a source region, a drain region, and a channel region defined in the semiconductor substrate. The TFET device also has a gate structure overlying at least a portion of the channel region. The source region is highly doped with an impurity dopant having a first conductivity type, and the drain region is highly doped with an impurity dopant having a second conductivity type. The layer of relatively low bandgap semiconductor material promotes tunneling at a first junction between the source region and the channel region, and the layer of relatively high bandgap semiconductor material inhibits tunneling at a second junction between the source region and the channel region.

20 Claims, 5 Drawing Sheets

TUNNELING FIELD EFFECT TRANSISTOR SWITCH DEVICE

TECHNICAL FIELD

Embodiments of the subject matter described herein relate generally to semiconductor devices. More particularly, embodiments of the subject matter relate to an improved tunneling field effect transistor (TFET) structure that is suitable for use as a semiconductor switch device.

BACKGROUND

The prior art includes TFET devices, which can be used as semiconductor switches. Conventional TFET devices take advantage of tunneling current between the source region and the channel region. The tunneling occurs under certain bias voltage conditions; otherwise, the TFET device functions as a reverse-biased diode. In this regard, FIG. 1 is a schematic cross sectional view of a conventional N-type TFET device 100. TFET device 100 includes a layer of semiconductor material 102, a source region 104, a drain region 106, and a gate structure 108. Most of semiconductor material 102 is lightly doped with an N-type impurity (N−). Source region 104, which is formed in semiconductor material 102, is highly doped with a P-type impurity (P+). Drain region 106, which is also formed in semiconductor material 102, is highly doped with an N-type impurity (N+). TFET device 100 includes a channel region 110 that is located between source region 104 and drain region 106. As shown in FIG. 1, channel region 110 is generally located below gate structure 108, as is well understood.

When used as a semiconductor switch device, TFET device 100 is biased such that the drain voltage (Vd) is higher than the source voltage (Vs). The gate voltage (Vg) is then controlled to turn the switch on or off. More specifically, if Vg is higher than the threshold voltage (Vt) of TFET device 100, then the switch turns on and source-to-drain current flows. If, however, Vg is less than Vt, then the switch remains off, TFET device 100 functions as a reverse-biased diode, and no current flows. FIG. 1 depicts a state where TFET device 100 is conducting source-to-drain current (Vs=0.0 volts; Vg=1.0 volts; Vd=1.0 volts). Under these bias conditions, electrons accumulate in channel region 110 near the upper surface of semiconductor material 102 and directly under gate structure 108. This accumulation of electrons in turn creates a very well defined and localized P+/N+ junction between source region 104 and channel region 110. This stiff P+/N+ junction represents a tunneling junction 112 for TFET device 100. Electrons and holes can easily pass or tunnel through tunneling junction 112, which results in high source-to-drain current.

A TFET device may also be fabricated as a P-type device. FIG. 2 is a schematic cross sectional view of a conventional P-type TFET device 200. TFET device 200 (which is very similar to TFET device 100) includes a layer of semiconductor material 202, a source region 204, a drain region 206, and a gate structure 208. In contrast to TFET device 100, however, most of semiconductor material 202 is lightly doped with a P-type impurity (P−), source region 204 is highly doped with an N-type impurity (N+), and drain region 206 is highly doped with a P-type impurity (P+). TFET device 200 includes a channel region 210 that is located between source region 204 and drain region 206.

When used as a semiconductor switch device, TFET device 200 is biased such that Vd is less than Vs. The gate voltage (Vg) is then controlled to turn the switch on or off. More specifically, if Vg is lower than Vt, then the switch turns on and source-to-drain current flows. If, however, Vg is greater than Vt, then the switch remains off. FIG. 2 depicts a state where TFET device 200 is conducting source-to-drain current (Vs=1.0 volts; Vg=0.0 volts; Vd=0.0 volts). Under these bias conditions, holes accumulate in channel region 210 near the upper surface of semiconductor material 202 and directly under gate structure 208. This accumulation of holes in turn creates a very well defined and localized N+/P+ junction between source region 204 and channel region 210. This stiff N+/P+ junction represents a tunneling junction 212 for TFET device 200. Electrons and holes can easily pass or tunnel through tunneling junction 212, which results in high source-to-drain current.

BRIEF SUMMARY

A semiconductor device is provided, wherein the semiconductor device includes a first layer of semiconductor material, a second layer of semiconductor material overlying the first layer of semiconductor material, the second layer of semiconductor material comprising a relatively low bandgap material, and a third layer of semiconductor material overlying the second layer of semiconductor material, the third layer of semiconductor material comprising a relatively high bandgap material. The semiconductor device also includes a gate structure formed on the third layer of semiconductor material, a source region defined in the third layer of semiconductor material and in the second layer of semiconductor material, and a drain region defined in the third layer of semiconductor material and in the second layer of semiconductor material.

Also provided is a semiconductor switch device having a semiconductor substrate, a gate structure formed on the semiconductor substrate, a source region defined in the semiconductor substrate, a drain region defined in the semiconductor substrate, and a channel region defined in the semiconductor substrate. The source region is heavily doped with a first conductivity type impurity, the drain region is heavily doped with a second conductivity type impurity, and at least a portion of the channel region is underlying the gate structure. In the channel region, the semiconductor substrate comprises an upper layer formed from a relatively high bandgap material and a lower layer formed from a relatively low bandgap material.

A TFET device is also provided. The TFET device includes a semiconductor substrate comprising a layer of relatively intermediate bandgap semiconductor material, a layer of relatively low bandgap semiconductor material overlying the layer of relatively intermediate bandgap semiconductor material, and a layer of relatively high bandgap semiconductor material overlying the layer of relatively low bandgap semiconductor material. The TFET device also includes a source region defined in the semiconductor substrate, the source region being highly doped with impurity dopant having a first conductivity type. The TFET device also includes a drain region defined in the semiconductor substrate, the drain region being highly doped with impurity dopant having a second conductivity type. The TFET device also includes a channel region defined in the semiconductor substrate between the source region and the drain region, and a gate structure formed on the semiconductor substrate, the gate structure overlying at least a portion of the channel region. The layer of relatively low bandgap semiconductor material promotes tunneling at a first junction between the source region and the channel region, and the layer of relatively high bandgap semiconductor material inhibits tunneling at a second junction between the source region and the channel region.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

The techniques and technologies described herein may be utilized to fabricate MOS devices, including NMOS transistor switch devices, PMOS transistor switch devices, and CMOS devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Semiconductor switches based on conventional CMOSFET designs perform well if the transistors are relatively large. Modern semiconductor fabrication processes, however, create extremely small scale devices. For example, modern processes can employ 15 nm node technologies that result in very short gate lengths. At such a small scale, conventional CMOSFET switches do not perform reliably or adequately, if at all. TFET switch devices have been introduced as an alternative to conventional CMOSFET switches, and TFET switch devices do not suffer from the same scaling limitations as CMOSFET switches.

Figure 1:
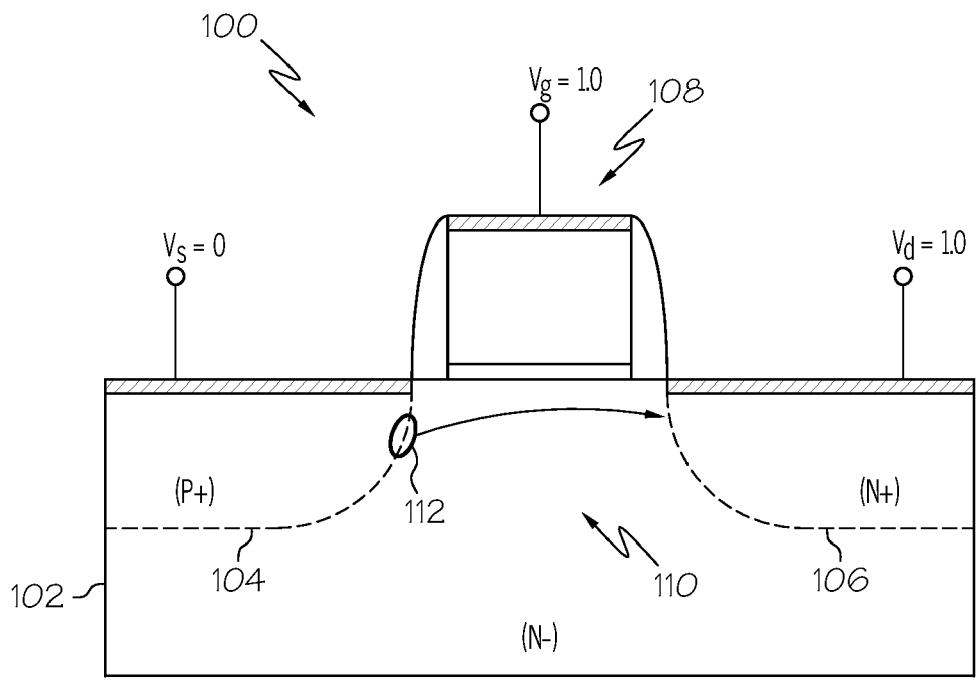
FIG. 1 is a schematic cross sectional view of a conventional N-type TFET device.
Figure 2:
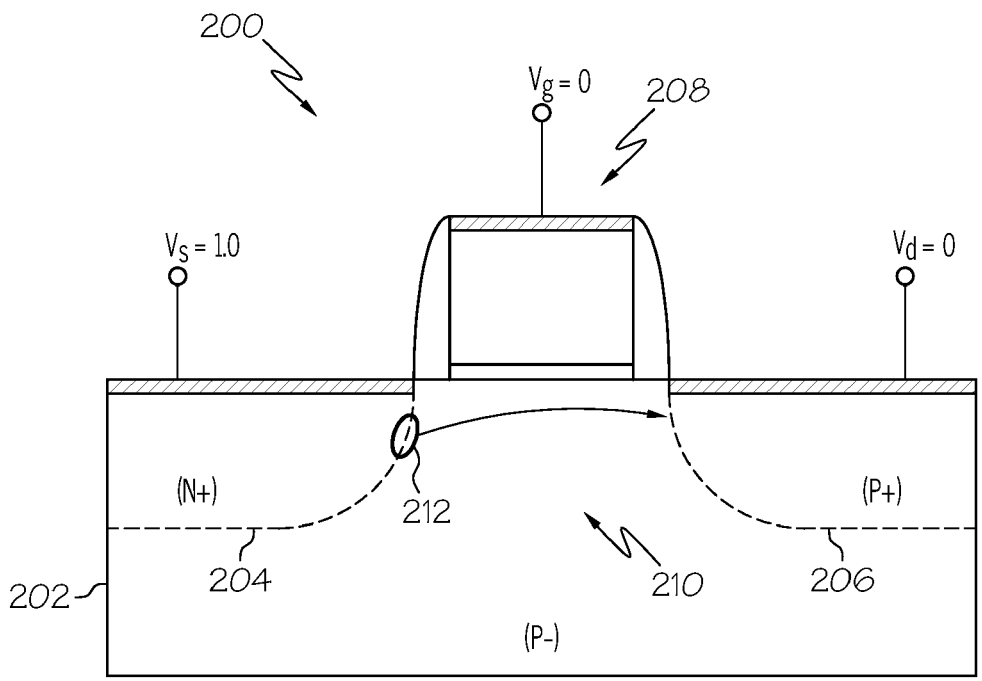
FIG. 2 is a schematic cross sectional view of a conventional P-type TFET device.

Ideally, the source junction of a TFET switch device is precisely aligned with the sidewall of the gate structure, as depicted in FIG. 1 and FIG. 2. With such edge alignment, the vertical field from the gate structure is less than the lateral field from the source region. Accordingly, the on/off transition (current conduction) for an edge-aligned TFET switch device is not critically dependent on the gate bias, which results in sharp on/off behavior. Manufacturing TFET switch devices with precise edge alignment between the gate structure and the source region is very difficult to achieve in practice. Rather, a given semiconductor fabrication process may result in some edge-aligned TFET switch devices, and some "offset" TFET switch devices.

Figure 3:
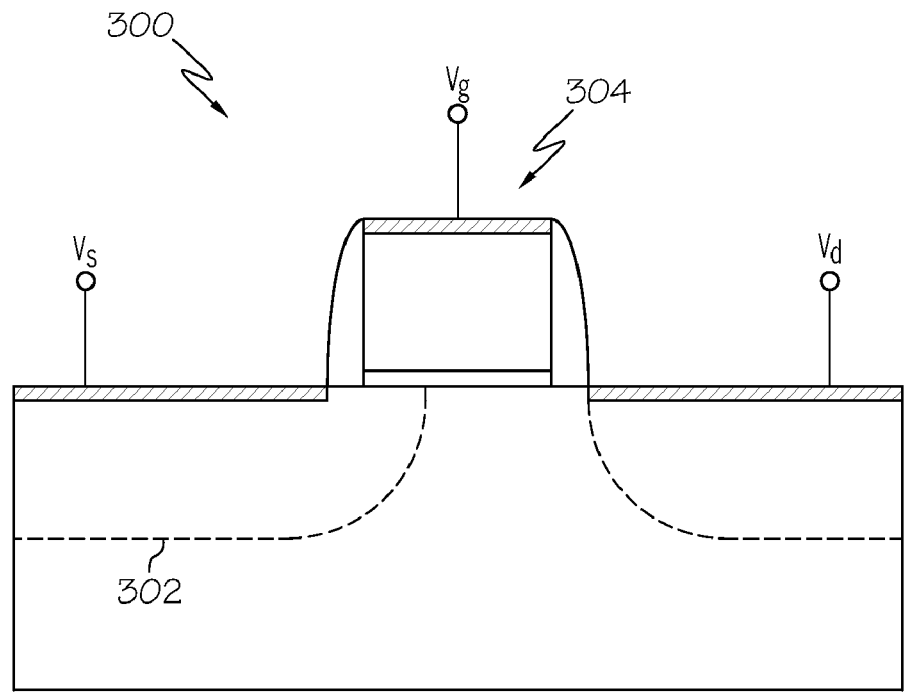
FIG. 3 is a schematic cross sectional view of a TFET device having an inwardly offset source region.

FIG. 3 is a schematic cross sectional view of a TFET device 300 having an inwardly offset source region 302. Here, source region 302 protrudes beneath the gate structure 304 of TFET device 300; gate structure 304 overlaps at least a portion of source region 302. If the source-to-channel junction is located under gate structure 304, then gate induced drain leakage current will be caused by the vertical electric field established between source region 302 and gate structure 304 (under bias conditions intended to switch TFET device 300 on). The gate induced drain leakage current will increase the driving current, but it will be strongly dependent upon the gate field. As a result, the off/on characteristic of TFET device 300 is less than ideal. More specifically, the off/on transition is gradual rather than steep and sharp as desired.

Figure 4:
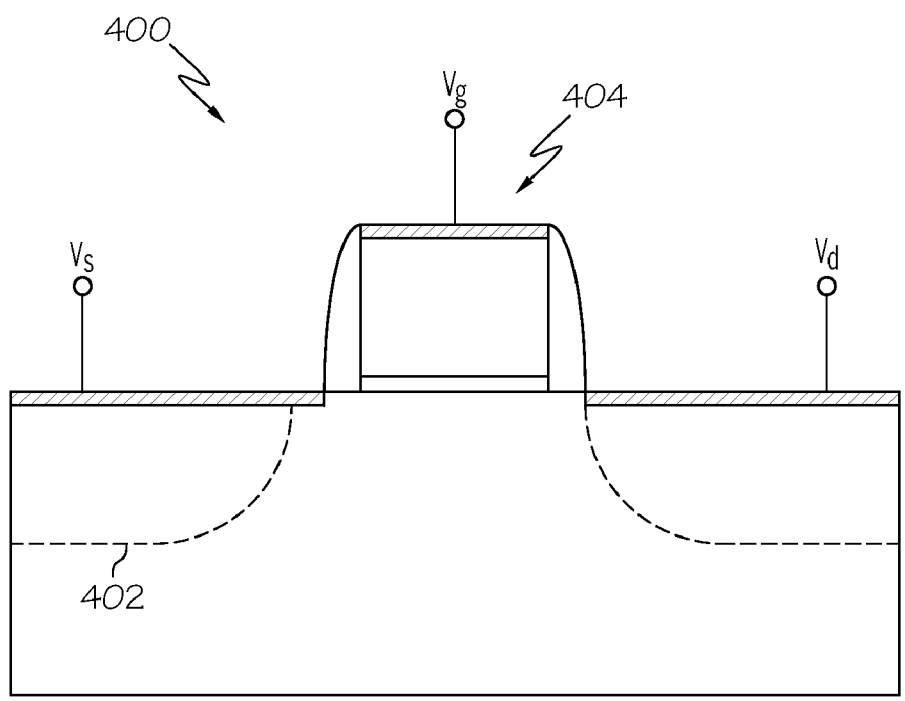
FIG. 4 is a schematic cross sectional view of a TFET device having an outwardly offset source region.

Conversely, FIG. 4 is a schematic cross sectional view of a TFET device 400 having an outwardly offset source region 402. Here, source region 402 is spaced apart from the gate structure 404 of TFET device 400; the edge of gate structure 404 is not aligned with the source junction. If the source junction is located a distance away from gate structure 404, then the required tunneling distance becomes extended (relative to the ideal gate-aligned configuration). As a result, the performance of TFET device 400 is less than ideal. More specifically, current conduction suffers and the amount of current is less than that exhibited by an ideal gate-aligned TFET device.

The semiconductor TFET switch device described below has an improved structure that makes it less sensitive to source/gate misalignment. Even if source/gate misalignment occurs, the TFET switch device described below will still function as intended. Thus, the current conduction and off/on transition characteristics of the TFET switch device are relatively predictable and consistent over a range of practical fabrication tolerances.

Figure 5:
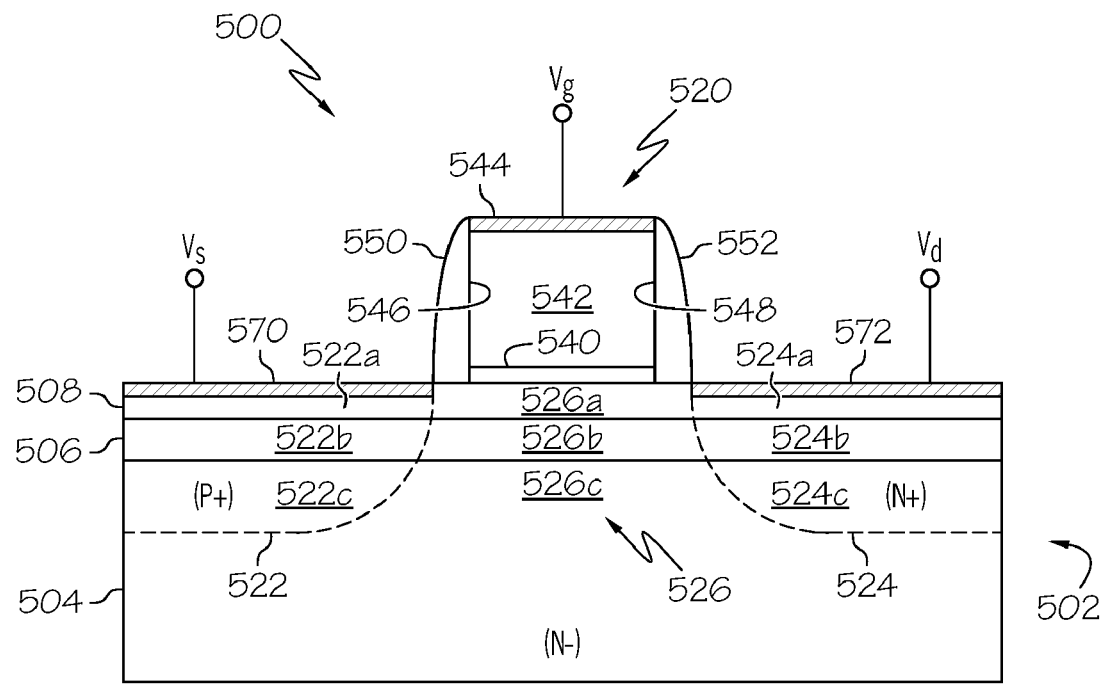
FIG. 5 is a schematic cross sectional view of an exemplary embodiment of an N-type TFET device.

FIG. 5 is a schematic cross sectional view of an exemplary embodiment of an N-type TFET device 500. Although the following description refers to an N-type implementation, the concepts, techniques, and technologies also apply equivalently to a P-type implementation. Those familiar with semiconductor devices and related manufacturing processes will understand how an equivalent P-type TFET device can be fabricated and operated. Indeed, both N-type and P-type TFET devices could be fabricated on a common wafer using CMOS process technologies.

The illustrated embodiment of TFET device 500 is formed on a semiconductor substrate 502. Semiconductor substrate 502 includes, without limitation: a first layer of semiconductor material 504; a second layer of semiconductor material 506 overlying the first layer of semiconductor material 504; and a third layer of semiconductor material 508 overlying the second layer of semiconductor material 506. The first layer of semiconductor material 504 is preferably a silicon material as typically used in the semiconductor industry, e.g., relatively pure silicon as well as silicon admixed with other elements. Alternatively, the first layer of semiconductor material 504 may be germanium, gallium arsenide, or the like. The first layer of semiconductor material 504 can be either N-type or P-type, but is typically P-type (which is then doped with an appropriate impurity dopant). Moreover, the first layer of semiconductor material 504 may be part of a bulk semiconductor wafer, or it may be realized as a thin layer of semiconductor material on an insulating substrate (commonly known as semiconductor-on-insulator or SOI) that, in turn, is supported by a carrier wafer.

For this embodiment, the first layer of semiconductor material 504 comprises silicon that is lightly doped with an N-type impurity dopant such as arsenic, phosphorus, or antimony. This lightly doped state is indicated by the label (N−) in FIG. 5. In exemplary embodiments, the doping concentration may be in the range between about $10^{16}$ to $10^{18}$ cm$^{-3}$. Typically, the first layer of semiconductor material 504 will be realized as a lightly doped N-type well formed within a larger region of a P-type semiconductor layer (not shown in FIG. 5).

The second layer of semiconductor material 506 is preferably a silicon material that is admixed with at least one other element. For example, the second layer of semiconductor material 506 may include silicon germanium (SiGe), pure Ge, GaAs, or InGaAs. In preferred embodiments, the second layer of semiconductor material 506 is epitaxially grown SiGe that is grown to a desired thickness on the first layer of semiconductor material 504 using well known techniques and technologies. Although the actual thickness of the second layer of semiconductor material 506 may vary to suit the particular application, a typical thickness can be within the range of about 5-50 nm. The epitaxially grown SiGe material need not be in-situ doped, for reasons that will become apparent.

The third layer of semiconductor material 508 is preferably a silicon material that is admixed with at least one other element. For example, the third layer of semiconductor material 508 may include silicon carbon (SiC), or pure Si. In preferred embodiments, the third layer of semiconductor material 508 is epitaxially grown SiC that is grown to a desired thickness on the second layer of semiconductor material 506 using well known techniques and technologies. As shown in FIG. 5, the second layer of semiconductor material 506 resides between the first layer of semiconductor material 504 and the third layer of semiconductor material 508. Although the actual thickness of the third layer of semiconductor material 508 may vary to suit the particular application, a typical thickness can be within the range of about 1-5 nm. The epitaxially grown SiC material need not be in-situ doped, for reasons that will become apparent.

Notably, the first layer of semiconductor material 504 is formed from a relatively intermediate bandgap material, the second layer of semiconductor material 506 is formed from a relatively low bandgap material, and the third layer of semiconductor material 508 is formed from a relatively high bandgap material. As used herein, "bandgap" refers to an energy difference (typically expressed in electron volts, eV) between the valence band and the conduction band of a semiconductor material. The bandgap energy represents the minimum amount of energy needed for an electron to jump from the valence band to the conduction band.

In certain embodiments, the relatively low bandgap material used for the second layer of semiconductor material 506 exhibits a bandgap within the range of about 1.0 to 1.2 eV, the relatively intermediate bandgap material used for the first layer of semiconductor material 504 exhibits a bandgap within the range of about 0.6 to 1.0 eV, and the relatively high bandgap material used for the third layer of semiconductor material 508 exhibits a bandgap within the range of about 1.0 to 2.8 eV. It should be appreciated that the specific bandgap values may vary from one device to another, from one fabrication process to another, and/or to suit the needs of the given application. The above exemplary ranges are typical, and are not intended to limit or otherwise restrict the scope of the subject matter described herein.

TFET device 500 also includes a gate structure 520 formed on semiconductor substrate 502. More specifically, gate structure 520 is formed overlying the third layer of semiconductor material 508. TFET device 500 also includes a source region 522 defined in semiconductor substrate 502, a drain region 524 defined in semiconductor substrate 502, and a channel region 526 defined in semiconductor substrate 502. Channel region 526 is located between source region 522 and drain region 524, and gate structure 520 overlies at least a portion of channel region 526.

Gate structure 520 may include a gate insulator 540, a gate electrode 542 overlying gate insulator 540, and a gate contact area 544. Gate insulator 540 can be formed from a layer of thermally grown silicon dioxide or a deposited insulator such as a silicon oxide, silicon nitride, or the like. Gate insulator 540 preferably has a thickness of about 1-10 nm, although the actual thickness can be determined based on the particular application or circuit being implemented. In accordance with one embodiment, gate electrode 542 is formed from polycrystalline silicon. Gate contact area 544 is preferably realized as a metal silicide area formed on gate electrode 542.

Gate structure 520 includes two sidewalls: a source sidewall 546 that is proximate the source side of TFET device 500; and a drain sidewall 548 that is proximate the drain side of TFET device 500. The illustrated embodiment of TFET device 500 includes a spacer 550 on source sidewall 546, and a spacer 552 on drain sidewall 548. Spacers 550/552 are formed from a suitable dielectric material such as silicon oxide and/or silicon nitride, preferably silicon nitride.

During fabrication of TFET device 500, gate structure 520 may be used as a part of an ion implantation mask (during one or more ion implantation steps that create source region 522 and drain region 524). In this regard, source region 522 and drain region 524 can be formed by implanting ions of an appropriate species. In preferred embodiments, source region 522 becomes heavily doped with a P-type impurity dopant (as indicated by the P+ label), and drain region 524 becomes heavily doped with an N-type impurity dopant (as indicated by the N+ label). The P-type dopant may be, without limitation: boron, aluminum, gallium, or indium. The N-type impurity may be, without limitation: arsenic, phosphorus, or antimony. In exemplary embodiments, the doping concentration may be in the range between about $10^{20}$ to $5 \times 10^{21}$ cm$^{-3}$.

For the illustrated embodiment, at least a portion of source region 522 is defined and formed in each of the three layers of semiconductor substrate 502. In other words, portions of all three layers are heavily doped to form the P+ source region 522. More specifically, an upper portion 522a of source region 522 is defined in the third layer of semiconductor material 508, a middle portion 522b of source region 522 is defined in the second layer of semiconductor material 506, and a lower portion 522c of source region 522 is defined in the first layer of semiconductor material 504. Similarly, at least a portion of drain region 524 is defined and formed in each of the three layers of semiconductor substrate 502. Thus, portions of all three layers are heavily doped to form the N+ drain region 524. More specifically, an upper portion 524a of drain region 524 is defined in the third layer of semiconductor material 508, a middle portion 524b of drain region 524 is defined in the second layer of semiconductor material 506, and a lower portion 524c of drain region 524 is defined in the first layer of semiconductor material 504. Likewise, channel region 526 includes or is formed in each of the three layers of semiconductor substrate 502. In other words, an upper portion 526a of channel region 526 is defined in the third layer of semiconductor material 508, a middle portion 526b of channel region 526 is defined in the second layer of semiconductor material 506, and a lower portion 526c of channel region 526 is defined in the first layer of semiconductor material 504.

Figure 6:
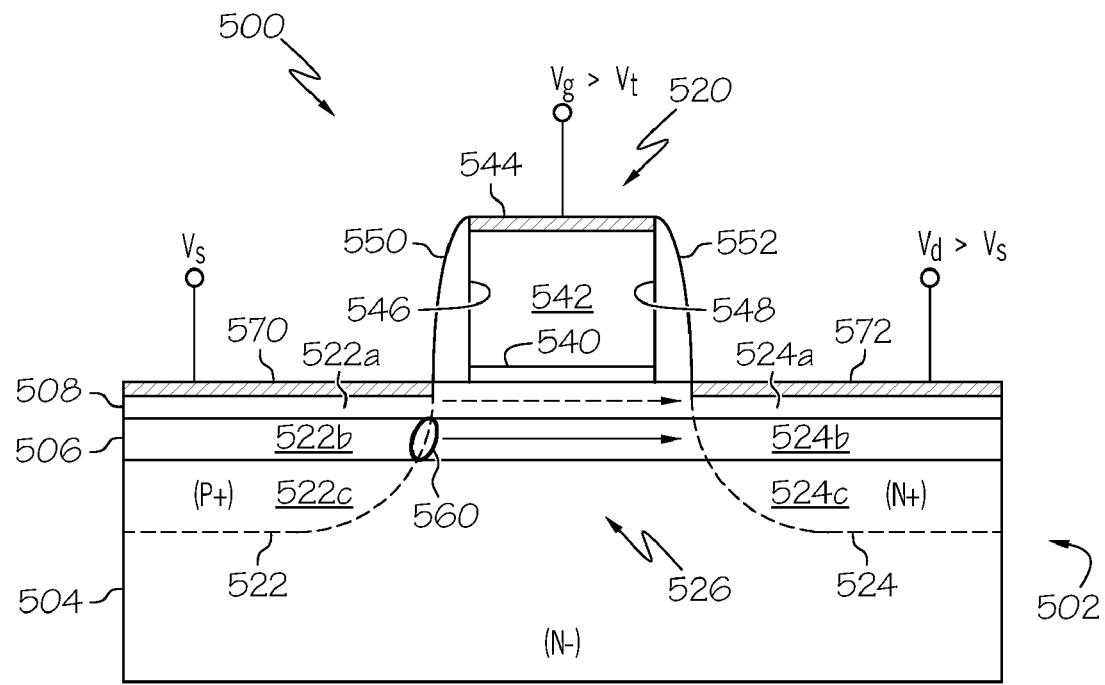
FIG. 6 is a schematic cross sectional view of the N-type TFET depicted in FIG. 5, while operating in a current conducting state.

As described above, the third layer of semiconductor material 508 has a relatively large bandgap, the second layer of semiconductor material 506 has a relatively small bandgap, and the first layer of semiconductor material 504 has a relatively intermediate bandgap (i.e., a bandgap that falls between the relatively small bandgap and the relatively large bandgap). The relatively low bandgap material used for the second layer of semiconductor material 506 enhances and promotes tunneling at a junction that is defined in the second layer of semiconductor material 506. More particularly, this enhanced tunneling occurs at a junction between source region 522 and channel region 526, where the junction is located in the second layer of semiconductor material 506. FIG. 6 includes a circled region that indicates this source-to-channel junction 560. Referring also to FIG. 5, source-to-channel junction 560 represents the junction between the middle portion 522b of source region 522 and the middle portion 526b of channel region 526. Conversely, the relatively high bandgap material used for the third layer of semiconductor material 508 inhibits or impedes tunneling at a junction that is defined in the third layer of semiconductor material 508. More particularly, tunneling is reduced, impeded, or inhibited at a second junction between source region 522 and channel region 526, where this second junction is located in the third layer of semiconductor material 508. Referring also to FIG. 5, this second junction represents the junction between the upper portion 522a of source region 522 and the upper portion 526a of channel region 526.

TFET device 500 includes a source contact area 570 for source region 522, and a drain contact area 572 for drain region 524. Source contact area 570 is preferably realized as a metal silicide area formed on the section of the third layer of semiconductor material 508 that corresponds to upper portion 522a of source region 522. Similarly, drain contact area 572 is preferably realized as a metal silicide area formed on the section of the third layer of semiconductor material 508 that corresponds to upper portion 524a of drain region 524. Source contact area 570, gate contact area 544, and drain contact area 572 are utilized to establish respective bias potentials for source region 522, gate electrode 542, and drain region 524, as is well understood. Although not depicted in the figures, TFET device 500 may include additional features, elements, and/or layers, such as an overlying dielectric layer and conductive plugs formed in the dielectric layer. The conductive plugs are electrically coupled to source contact area 570, gate contact area 544, and drain contact area 572, and the conductive plugs are used to provide the various bias voltages to TFET device 500.

FIG. 6 depicts TFET device 500 under bias conditions that turn the switch on, i.e., TFET device 500 conducts current. The bias conditions are as follows: Vd>Vs; and Vg>Vt. Under these conditions, the relatively low bandgap characteristics of the second layer of semiconductor material 506 results in tunneling at the source-to-channel junction 560. In turn, relatively high source-to-drain current flows within the second layer of semiconductor material 506 (the solid arrow in FIG. 6 represents this current flow). Conversely, the relatively high bandgap characteristics of the third layer of semiconductor material 508 results in little or no tunneling at the source-to-channel junction in the third layer of semiconductor material 508. Although a small amount of source-to-drain current may flow within the third layer of semiconductor material 508 (the dashed arrow in FIG. 6 represents this current flow), a significant amount of the overall source-to-drain current results from the tunneling at the source-to-channel junction 560.

Notably, the configuration of TFET device 500 is such that tunneling occurs deeper in the semiconductor substrate 502 (compared to conventional structures that achieve tunneling at or near the lower surface of the gate structure). Accordingly, TFET device 500 is designed to improve tunneling efficiency below gate structure 520, and to degrade tunneling efficiency directly below gate structure 520. These characteristics of TFET device 500 make it less sensitive to offsetting of gate structure 520 relative to source region 522. Therefore, it is possible to design the device with the source region 522 inwardly offset relative to gate structure 520. This will give more process control margin than conventional structures, which require perfect alignment between the source region and the gate structure. In operation, the tunneling (on/off) characteristics of TFET device 500 are less dependent on Vg, relative to conventional TFET designs.

FIG. 5 and FIG. 6 depict an NTFET device implementation. Those familiar with semiconductor devices and related manufacturing processes will understand that the techniques and technologies described above for TFET device 500 can be extended and equivalently applied to a PTFET device implementation. The same semiconductor substrate configuration, materials, and properties are utilized for both NTFET and PTFET implementations. For a PTFET device, however, the device will be formed in a lightly doped P-type region, the source region will be heavily doped with an N-type impurity, and the drain region will be heavily doped with a P-type impurity. In addition, the bias voltages will be different (as explained above with reference to FIG. 2).

A TFET device (such as TFET device 500) can be fabricated using known semiconductor fabrication techniques. The TFET devices described herein can be fabricated using relatively small scale semiconductor device manufacturing process technologies, e.g., 32 nm node technology, 15 nm node technology, and beyond (however, the use of such node technologies is not a requirement). Moreover, a suitable CMOS manufacturing process could be used to create both NTFET and PTFET switch devices on a common substrate.

Figure 7:
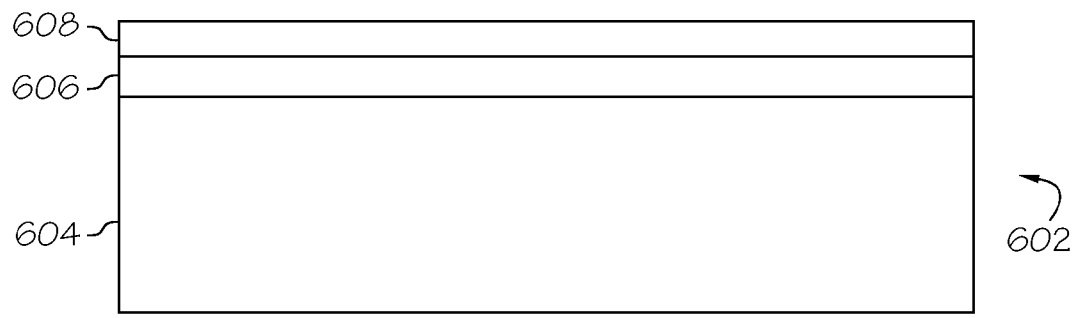
FIGS. 7-10 are schematic cross sectional views that illustrate an exemplary fabrication process for an N-type TFET device.

FIGS. 7-10 are schematic cross sectional views that illustrate an exemplary fabrication process for an N-type TFET device. Referring to FIG. 7, the fabrication process may begin with a suitably configured semiconductor substrate 602. This embodiment of semiconductor substrate 602 includes a layer of silicon material 604 that is lightly doped with an N-type impurity species, a layer of SiGe material 606 formed on silicon material 604, and a layer of SiC material 608 formed on SiGe material 606. As mentioned previously, silicon material 604 has a relatively intermediate bandgap characteristic, SiGe material 606 has a relatively low bandgap characteristic, and SiC material 608 has a relatively high bandgap characteristic. Semiconductor substrate 602 may be created by epitaxially growing SiGe material 606 on silicon material 604, and by thereafter epitaxially growing SiC material 608 on SiGe material 606.

Figure 8:
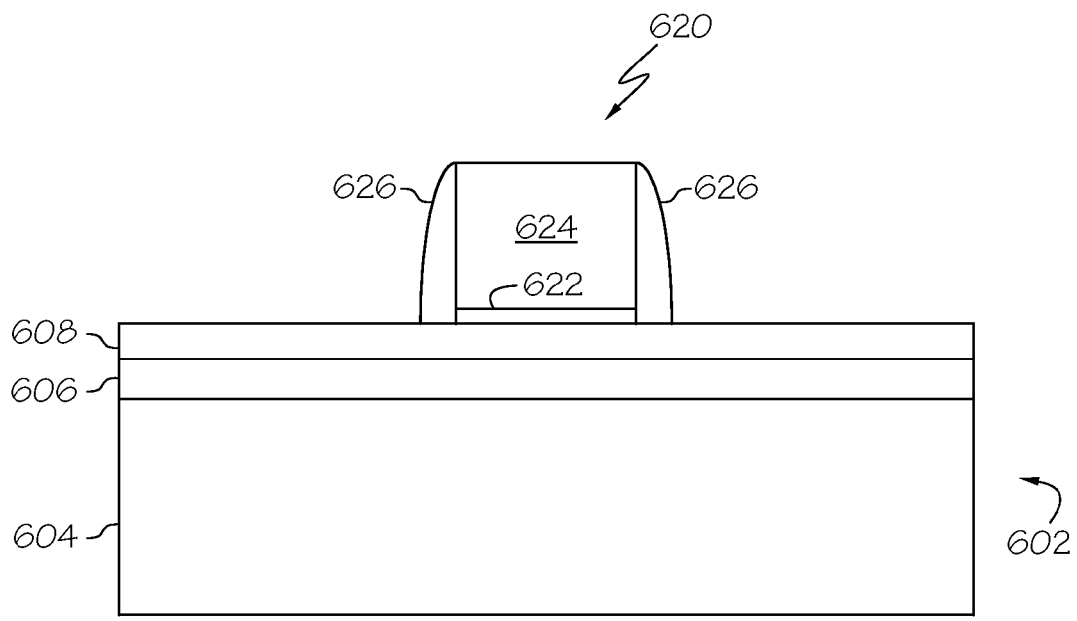

Although other fabrication steps or sub-processes may be performed on semiconductor substrate 602, this example continues by forming a gate structure 620 on semiconductor substrate 602 (see FIG. 8). Gate structure 620 can be formed using well known process steps that are typically associated with a gate module in an overall fabrication process. These process steps may involve, without limitation: material deposition, growth, or forming steps; photolithography steps; etching steps; cleaning steps; and the like. As described above with reference to FIG. 5, gate structure 620 may include, without limitation: a gate insulator 622, a gate electrode 624, and sidewalls 626.

Figure 9:
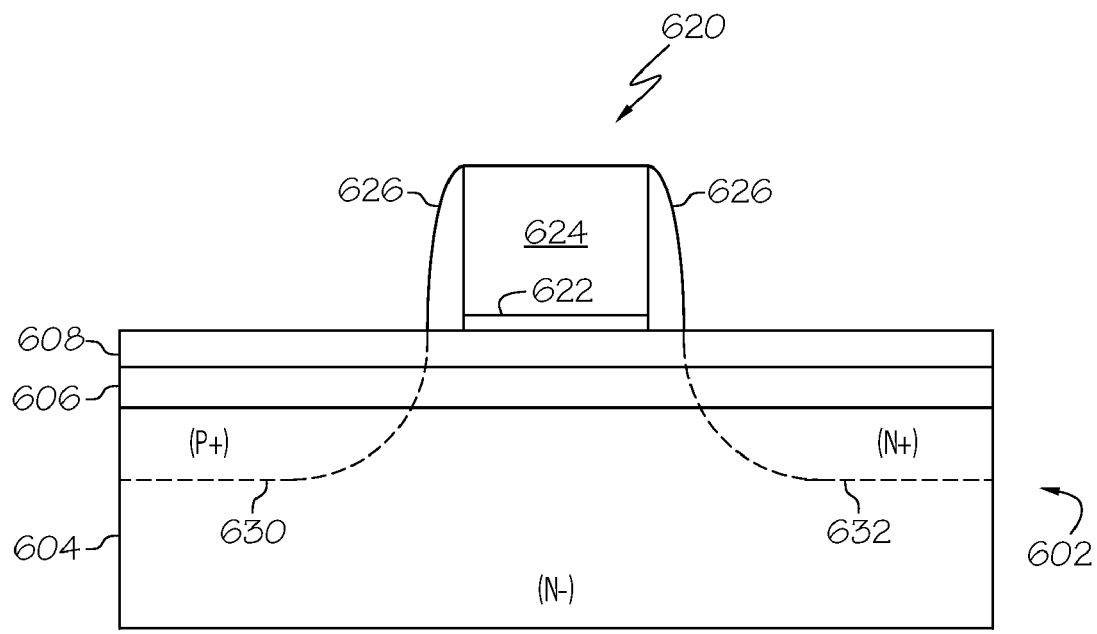

Although other fabrication steps or sub-processes may be performed after the formation of gate structure 620, this example continues by forming a source region 630 and a drain region 632 in semiconductor substrate 602 (see FIG. 9). For this NTFET implementation, source region 630 will be a heavily doped P-type region, and drain region 632 will be a heavily doped N-type region. Source region 630 can be formed by introducing ions of an appropriate P-type impurity species into the three layers of semiconductor substrate 602. Likewise, drain region 632 can be formed by introducing ions of an appropriate N-type impurity species into the three layers of semiconductor substrate 602. In practice, the formation of source region 630 and drain region 632 may require two separate ion implantation steps, using gate structure 620 and possibly other structures such as patterned photoresist material (not shown) as an ion implantation mask.

Figure 10:
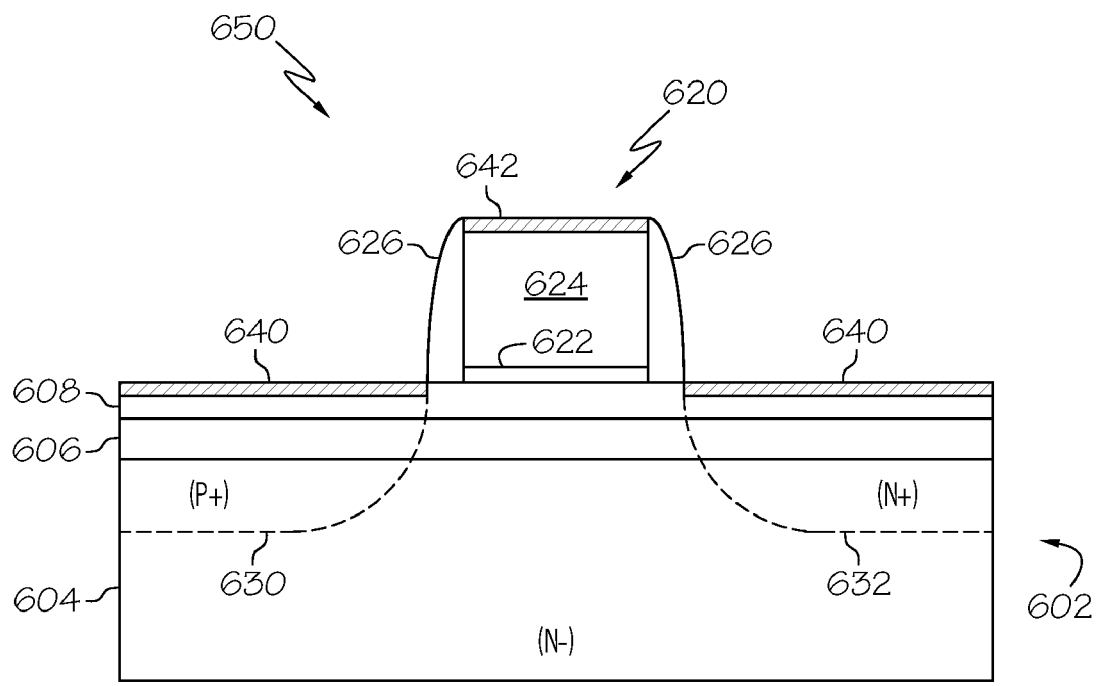

Although other fabrication steps or sub-processes may be performed at this time (e.g., thermal annealing, formation of additional spacers, etc.), this example continues by forming metal silicide contact areas 640 on the exposed areas of SiC material 608. In addition, a metal silicide contact area 642 may be formed on gate electrode 624 (see FIG. 10). It should be apparent that FIG. 10 depicts a TFET device structure 650 after a number of known process steps have been performed. For the sake of brevity, these intermediate steps will not be described in detail. In practice, an appropriate silicidation process is performed to create metal silicide contact areas 640 and 642. For example, a layer of silicide-forming metal (not shown) is deposited onto the surfaces of SiC material 608 and onto the surface of gate electrode 624. The silicide-forming metal can be deposited, for example, by sputtering to a thickness of about 5-50 nm and preferably to a thickness of about 10 nm. The semiconductor substrate 602 is then heated, for example by rapid thermal annealing, to form metal silicide contact areas 640 and 642. The silicide-forming metal can be, for example, cobalt, nickel, rhenium, ruthenium, or palladium, or alloys thereof. Any silicide-forming metal that is not in contact with exposed silicon does not react during heating and, therefore, does not form a silicide. This excess metal may be removed by wet etching or any suitable procedure.

Thereafter, any number of known process steps can be performed to complete the fabrication of the TFET switch device. For example, an insulating layer may be formed over TFET device structure 650, and the insulating layer may be used to accommodate conductive plugs for metal silicide contact areas 640 and 642. In turn, the conductive plugs can be utilized to control the bias voltage conditions of the TFET switch device (to turn the TFET switch device on and off). For the sake of brevity, additional backend process steps and the resulting TFET switch device are not shown or described here.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
a first layer of semiconductor material;
a second layer of semiconductor material overlying the first layer of semiconductor material, the second layer of semiconductor material comprising a relatively low bandgap material;
a third layer of semiconductor material overlying the second layer of semiconductor material, the third layer of semiconductor material comprising a relatively high bandgap material;
a gate structure formed on the third layer of semiconductor material;
a source region defined in the third layer of semiconductor material and in the second layer of semiconductor material; and
a drain region defined in the third layer of semiconductor material and in the second layer of semiconductor material.

2. The semiconductor device of claim 1, wherein:
the semiconductor device is an N-type tunneling field effect transistor (NTFET);
the first layer of semiconductor material is lightly doped with an N-type impurity;
the source region is heavily doped with a P-type impurity; and
the drain region is heavily doped with an N-type impurity.

3. The semiconductor device of claim 1, wherein:
the semiconductor device is a P-type tunneling field effect transistor (PTFET);
the first layer of semiconductor material is lightly doped with a P-type impurity;
the source region is heavily doped with an N-type impurity; and
the drain region is heavily doped with a P-type impurity.

4. The semiconductor device of claim 1, wherein:
the first layer of semiconductor material comprises silicon;
the second layer of semiconductor material comprises silicon germanium; and
the third layer of semiconductor material comprises silicon carbon.

5. The semiconductor device of claim 4, wherein:
the second layer of semiconductor material comprises epitaxially grown silicon germanium; and
the third layer of semiconductor material comprises epitaxially grown silicon carbon.

6. The semiconductor device of claim 1, wherein the first layer of semiconductor material comprises a relatively intermediate bandgap material.

7. The semiconductor device of claim 1, wherein the source region is defined in the third layer of semiconductor material, in the second layer of semiconductor material, and in the first layer of semiconductor material.

8. The semiconductor device of claim 1, wherein the drain region is defined in the third layer of semiconductor material, in the second layer of semiconductor material, and in the first layer of semiconductor material.

9. The semiconductor device of claim 1, wherein:
the relatively low bandgap material of the second layer of semiconductor material promotes tunneling at a first source junction defined in the second layer of semiconductor material; and
the relatively high bandgap material of the third layer of semiconductor material inhibits tunneling at a second source junction defined in the third layer of semiconductor material.

10. A semiconductor switch device comprising:
a semiconductor substrate;
a gate structure formed on the semiconductor substrate;
a source region defined in the semiconductor substrate, the source region being heavily doped with a first conductivity type impurity;
a drain region defined in the semiconductor substrate, the drain region being heavily doped with a second conductivity type impurity; and
a channel region defined in the semiconductor substrate between the source region and the drain region, at least a portion of the channel region underlying the gate structure; wherein
in the channel region, the semiconductor substrate comprises an upper layer formed from a relatively high bandgap material, a lower layer formed from a relatively low bandgap material, and a lowermost layer formed from a relatively intermediate bandgap material.

11. The semiconductor switch device of claim 10, wherein:
the lower layer comprises silicon germanium; and
the upper layer comprises silicon carbon.

12. The semiconductor switch device of claim 10, wherein:
in the source region, the semiconductor substrate comprises the upper layer and the lower layer; and
in the drain region, the semiconductor substrate comprises the upper layer and the lower layer.

13. The semiconductor switch device of claim 10, wherein:
the relatively low bandgap material of the lower layer promotes tunneling at a first junction between the source region and the channel region, the first junction located in the lower layer; and
the relatively high bandgap material of the upper layer inhibits tunneling at a second junction between the source region and the channel region, the second junction located in the upper layer.

14. A tunneling field effect transistor (TFET) device comprising:
a semiconductor substrate comprising a layer of relatively intermediate bandgap semiconductor material, a layer of relatively low bandgap semiconductor material overlying the layer of relatively intermediate bandgap semiconductor material, and a layer of relatively high bandgap semiconductor material overlying the layer of relatively low bandgap semiconductor material;
a source region defined in the semiconductor substrate, the source region being highly doped with impurity dopant having a first conductivity type;
a drain region defined in the semiconductor substrate, the drain region being highly doped with impurity dopant having a second conductivity type;
a channel region defined in the semiconductor substrate between the source region and the drain region; and
a gate structure formed on the semiconductor substrate, the gate structure overlying at least a portion of the channel region;
wherein the layer of relatively low bandgap semiconductor material promotes tunneling at a first junction between the source region and the channel region; and
the layer of relatively high bandgap semiconductor material inhibits tunneling at a second junction between the source region and the channel region.

15. The TFET device of claim 14, wherein the layer of relatively intermediate bandgap semiconductor material is lightly doped with impurity dopant having the second conductivity type.

16. The TFET device of claim 14, wherein:
the layer of relatively intermediate bandgap semiconductor material comprises silicon;
the layer of relatively low bandgap semiconductor material comprises silicon germanium; and
the layer of relatively high bandgap semiconductor material comprises silicon carbon.

17. The TFET device of claim 14, wherein:
a first portion of the source region is defined in the layer of relatively high bandgap semiconductor material; and
a second portion of the source region is defined in the layer of relatively low bandgap semiconductor material.

18. The TFET device of claim 17, wherein a third portion of the source region is defined in the layer of relatively intermediate bandgap semiconductor material.

19. The TFET device of claim 17, wherein:
a first portion of the drain region is defined in the layer of relatively high bandgap semiconductor material; and
a second portion of the drain region is defined in the layer of relatively low bandgap semiconductor material.

20. The TFET device of claim 19, wherein a third portion of the drain region is defined in the layer of relatively intermediate bandgap semiconductor material.

* * * * *